US011227807B2

(12) United States Patent
Cumbie et al.

(10) Patent No.: US 11,227,807 B2
(45) Date of Patent: Jan. 18, 2022

(54) TWO-STEP MOLDING FOR A LEAD FRAME

(71) Applicant: Hewlett-Packard Development Company, L.P., Fort Collins, CO (US)

(72) Inventors: Michael W. Cumbie, Albany, OR (US); Chien-Hua Chen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/768,553

(22) PCT Filed: Nov. 16, 2018

(86) PCT No.: PCT/US2018/061597
§ 371 (c)(1),
(2) Date: May 29, 2020

(87) PCT Pub. No.: WO2020/101706
PCT Pub. Date: May 22, 2020

(65) Prior Publication Data
US 2020/0343153 A1 Oct. 29, 2020

(51) Int. Cl.
*H01L 23/31* (2006.01)
*H01L 23/495* (2006.01)

(52) U.S. Cl.
CPC ........ *H01L 23/31* (2013.01); *H01L 23/49541* (2013.01); *H01L 23/49575* (2013.01)

(58) Field of Classification Search
CPC .......... B29C 45/14655; B29C 45/1671; H01L 23/31; H01L 23/3107; H01L 23/49541; H01L 23/49575; H01L 23/568
See application file for complete search history.

(56) References Cited

U.S. PATENT DOCUMENTS

| | | | |
|---|---|---|---|
| 5,239,198 A * | 8/1993 | Lin | .......... H01L 21/56 257/691 |
| 5,951,813 A | 9/1999 | Warren | |
| 6,344,687 B1 * | 2/2002 | Huang | ................ H01L 21/4832 257/724 |
| 6,910,874 B2 | 6/2005 | Bolken et al. | |
| 8,093,730 B2 | 1/2012 | Hall et al. | |
| 8,581,381 B2 | 11/2013 | Zhao et al. | |
| 9,379,034 B1 | 6/2016 | Goh et al. | |

(Continued)

FOREIGN PATENT DOCUMENTS

| | | | |
|---|---|---|---|
| DE | 4436523 B4 | 4/2007 | |
| DE | 102014208425 A1 | 5/2015 | |

(Continued)

*Primary Examiner* — Allan R Wilson
(74) *Attorney, Agent, or Firm* — Austin Rapp

(57) ABSTRACT

Examples for a two-step insert molding process to encapsulate a pre-molded lead frame (104, 304, 504, 704) are described herein. In some examples, a first circuit component (106, 306, 506) and a first portion of a trace array (110, 310, 510) of the pre-molded lead frame for an integrated circuit (1C) assembly are encapsulated by a first insert molding component (112, 312, 512a, 512b, 712). The trace array connects the first circuit component to a second circuit component (108, 308, 508) of the pre-molded lead frame. A second portion of the trace array is encapsulated by a second insert molding component (114, 314, 514, 714).

14 Claims, 8 Drawing Sheets

(56) References Cited

U.S. PATENT DOCUMENTS

| | | | |
|---|---|---|---|
| 9,536,760 | B2 | 1/2017 | De et al. |
| 9,595,454 | B2 | 3/2017 | Huang et al. |
| 9,952,137 | B2 | 4/2018 | Balmond et al. |
| 2002/0180424 | A1 | 12/2002 | Aoki |
| 2016/0282422 | A1 | 9/2016 | Schrader |
| 2019/0157190 | A1* | 5/2019 | Fuergut ............... H01L 21/4842 |

FOREIGN PATENT DOCUMENTS

| | | |
|---|---|---|
| WO | WO-2012084333 A1 | 6/2012 |
| WO | WO-2015000905 A1 | 1/2015 |

* cited by examiner

TWO-STEP MOLDING FOR A LEAD FRAME

BACKGROUND

Integrated circuits are used to perform a variety of tasks, including sensing and signal processing. Furthermore, integrated circuits are used in a variety of environments. In some cases, integrated circuits may be used in harsh or corrosive environments.

BRIEF DESCRIPTION OF THE DRAWINGS

Various examples will be described below by referring to the following figures.

Figure 1:
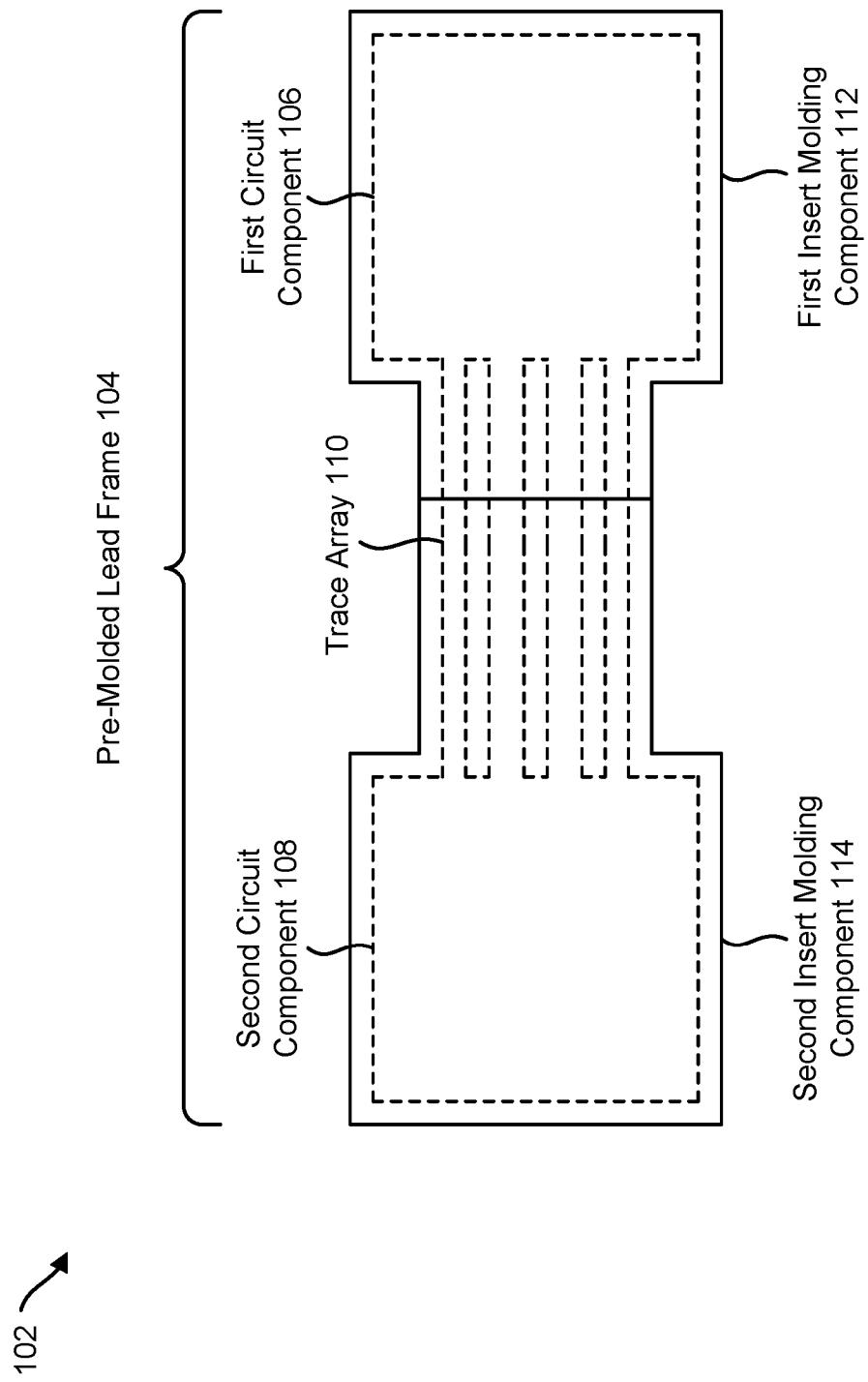
FIG. 1 is an example block diagram of a lead frame assembly in which a two-step insert molding process may be used to encapsulate a pre-molded lead frame.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

Examples of a two-step insert molding process to fully encapsulate a pre-molded lead frame for an integrated circuit (IC) assembly are described herein. The described two-step insert molding process may be used to protect the lead frame. For example, the two-step insert molding process may prevent the lead frame from being exposed to a harsh environment (e.g., corrosive liquids, ink, etc.).

FIG. 1 is an example block diagram of a lead frame assembly 102 in which a two-step insert molding process may be used to encapsulate a pre-molded lead frame 104. In some examples, the lead frame assembly 102 may be used as a carrier for an integrated circuit (IC) assembly. For example, IC components may be attached (e.g., wire bonded) to portions of the lead frame assembly 102.

In some examples, the lead frame assembly 102 may be used in sensor applications. For instance, the lead frame assembly 102 may be used as a die carrier substrate for a sensor assembly. Instead of a chip on board (COB) approach (e.g., printed circuit board (PCB), plastic, or metal carrier), the lead frame assembly 102 may include a fine-pitch metallic pre-molded lead frame 104 with thermoplastic or thermoset insert molding that forms a die carrier substrate for a sensor component. In this context, the lead frame assembly 102 may be referred to as a molded sensor assembly (MSA). In some examples, the lead frame assembly 102 may be used for ink level sensing.

Unlike the PCB for a COB approach, which has ink compatibility issues, a thermoplastic material or thermoset material may be used to protect the pre-molded lead frame 104 from exposure to a harsh environment. For example, in inkjet applications, Polyethylene terephthalate (PET), Polyphenylene sulfide (PPS), Liquid-crystal polymers (LCP) or other thermoplastics may be used to form the body of the lead frame assembly 102. In other examples, a thermoset material (e.g., epoxy) may be used to form the body of the lead frame assembly 102. The thermoplastic material or thermoset material may be used to encase portions of the pre-molded lead frame 104 that are exposed to an ink container to ensure good ink compatibility. For example, the molded material may protect the pre-molded lead frame 104 from corrosion from ink, which in turn protects the ink from contamination by the pre-molded lead frame 104. Additionally, compared with a PCB, the lead frame assembly 102 can serve as a die carrier as well as an electrical redistribution layer.

The pre-molded lead frame 104 may include a first circuit component 106, a second circuit component 108 and a trace array 110. It should be noted that the pre-molded lead frame 104 is depicted with dashed lines in FIG. 1. As used herein, dashed lines represent a hidden line (i.e., a part that is situated within or behind another part). In this case, the first circuit component 106, the second circuit component 108 and the trace array 110 may be situated within a first insert molding component 112 and/or a second insert molding component 114.

The pre-molded lead frame 104 may be fabricated from a metallic material (e.g., copper, gold, metal alloys, etc.). In some examples, the pre-molded lead frame 104 may be fabricated (e.g., pre-molded) in a panel format or reel-to-reel (R2R) format in which multiple pre-molded lead frames 104 may be formed (e.g., molded, stamped, punched, cut, etc.) on a single panel. In this fabrication process, the pre-molded lead frame 104 may remain attached to the panel after fabrication. This fabrication process for the pre-molded lead frame 104 may be referred to as panel molding or R2R molding. Insert molding may be performed on the pre-molded lead frame 104 while it is still attached to the panel.

The first circuit component 106 and the second circuit component 108 of the pre-molded lead frame 104 may include a number of paths for transmitting electrical current. In some examples, the first circuit component 106 and/or the second circuit component 108 may be configured to interface with additional electronic circuitry (e.g., IC components). For instance, the first circuit component 106 and/or the second circuit component 108 may include a number of contact pads for attaching to sensor circuitry or other electronic circuitry. It should be noted that the first circuit component 106 and the second circuit component 108 are represented as a block in FIG. 1. However, first circuit component 106 and the second circuit component 108 may include a number of electrical paths in various configurations.

The trace array 110 may include a number of conductive leads. A trace in the trace array 110 may be an electrically conductive path. The trace array 110 may connect the first circuit component 106 and the second circuit component 108. For example, the trace array 110 may include a number of conductive leads that connect circuits in the first circuit component 106 to circuits in the second circuit component 108.

In some examples, the trace array 110 may have a fine pitch. As used herein, the pitch of the trace array 110 refers to the thickness of an individual trace and the amount of separation between traces in the trace array 110. A fine pitch refers to a trace width and trace separation that is much smaller than the length of the trace array 110.

In some examples, the lead frame assembly 102 may be used for fluid sensing. For example, the lead frame assembly 102 may be a carrier for an IC assembly. In some examples, the IC assembly may be a fluid sense device. For instance, in the context of ink level sensing, the fluid sense device may measure the level of ink within a container.

The lead frame assembly 102 may include a first insert molding component 112 and a second insert molding component 114. In some examples, a portion of the lead frame assembly 102 may be exposed to a harsh environment. For instance, in the context of ink level sensing, the sensor portion of the lead frame assembly 102 may be fully immersed in ink. To protect the lead frame assembly 102 from damage, portions of the pre-molded lead frame 104 may be fully encapsulated with a thermoplastic material or thermoset material.

As used herein, "encapsulate" may refer to covering a first material (e.g., the pre-molded lead frame 104) with a second material (e.g., a thermoplastic material or thermoset material). The term "fully encapsulated" may refer to the first material (or a portion of the first material) being completely surrounded by the second material such that the first material (or the portion of the first material) is not exposed to an external environment.

The encapsulation may be performed using a two-step insert molding process. It should be noted that insert molding in a single step molding may not work for encapsulating the pre-molded lead frame 104 due to the structure of the trace array 110. In this case, there may be many long and unsupported fine-pitch metal traces in the trace array 110. A single-step molding of the thermoplastic on the pre-molded lead frame 104 may result in displacement of a trace. The displaced trace may contact another trace resulting in an electrical short. Furthermore, the forces exerted on an unsupported fine-pitch trace array 110 in a single-step molding may damage (e.g., break) the traces.

The trace array 110 may be supported during fabrication of the lead frame assembly 102 by using a two-step insert molding. A first insert molding component 112 may encapsulate the first circuit component 106 and a first portion of the trace array 110 of the pre-molded lead frame 104. As used herein, the term "insert molding" may refer to a process of molding thermoplastic material or thermoset material around a preformed component (e.g., the pre-molded lead frame 104) to create a finished part that incorporates multiple materials. The first insert molding component 112 may include an amount of material that is insert molded onto the first circuit component 106 and the first portion of the trace array 110.

A second insert molding component 114 may encapsulate a second portion of the trace array 110. The second insert molding component 114 may include an amount of material that is insert molded onto the second portion of the trace array 110.

In some examples, the second circuit component 108 may be encapsulated with the second insert molding component 114 (as shown in FIG. 1). In other words, in an approach, the second insert molding component 114 may encapsulate the second portion of the trace array 110 and the second circuit component 108. An example of this approach is described in connection with FIG. 3.

In some examples (not shown in FIG. 1), the second circuit component 108 may be encapsulated with the first insert molding component 112. In other words, in an approach, the first insert molding component 112 may encapsulate the first circuit component 106, the second circuit component 108 and the first portion of the trace array 110. The remainder of the trace array 110 may then be encapsulated by the second insert molding component 114. An example of this approach is described in connection with FIG. 5.

The first insert molding component 112 and the second insert molding component 114 may be a thermoplastic material and/or a thermoset material (e.g., epoxy mold compound). In some examples, the first insert molding component 112 and the second insert molding component 114 may be the same thermoplastic material or thermoset material. In some other examples, the first insert molding component 112 and the second insert molding component 114 may be different thermoplastic materials and/or thermoset materials.

The first insert molding component 112 and the second insert molding component 114 may encapsulate the pre-molded lead frame 104 to prevent exposure of the pre-molded lead frame 104 to a liquid. For example, the first insert molding component 112 and the second insert molding component 114 may fully encapsulate (e.g., surround) the trace array 110. It should be noted that certain portions of the pre-molded lead frame 104 may remain exposed after encapsulation by the first insert molding component 112 and the second insert molding component 114. For example, certain components (e.g., contact pads) on the pre-molded lead frame 104 may remain exposed to couple with other electrical components (e.g., sensor circuitry, processor circuitry, etc.).

In some examples, the first insert molding component 112 and/or the second insert molding component 114 may take the shape of the pre-molded lead frame 104 that they encapsulate. In other words, the first insert molding component 112 and/or the second insert molding component 114 may match the profile of the underlying pre-molded lead frame 104. In other examples the first insert molding component 112 and/or the second insert molding component 114 may extend beyond the pre-molded lead frame 104 to provide additional structure for the lead frame assembly 102. For example, the first insert molding component 112 and/or the second insert molding component 114 may be molded to provide surfaces upon which additional circuit components (e.g., sensor circuitry) may be mounted.

In some examples, the first insert molding component 112 and/or the second insert molding component 114 may form additional support for a pre-molded lead frame 104 that is still attached to a panel. For example, the first insert molding component 112 and/or the second insert molding component 114 may be molded to extend over a portion of the panel. Thus, the first insert molding component 112 and/or the second insert molding component 114 may stabilize the completed lead frame assembly 102 on a panel.

The first insert molding component 112 may support and electrically isolate the trace array 110. As described above, the fine-pitch traces of the trace array 110 may be fragile and prone to movement if left unsupported. Therefore, the trace array 110 may be supported before the first insert molding for the first insert molding component 112. In some examples, the trace array support may be a part of the pre-molded lead frame 104. For instance, the trace array support may be fabricated on the pre-molded lead frame 104 as part of the trace array 110. In other examples, a non-integral support (e.g., tape support) may be applied to the trace array 110 to support the trace array 110 during the first insert molding.

Upon molding the first insert molding component 112, the trace array 110 may be physically stabilized (e.g., supported) and electrically isolated (e.g., the traces may not move to create electrical shorts). In other words, the first insert molding component 112 may electrically isolate the traces in the trace array 110 to prevent an electrical short in the trace array 110.

The trace array support may be removed after molding the first insert molding component 112 and before molding the second insert molding component 114. In the integral support example where the trace array support is fabricated as part of the trace array 110, the trace array support may be separated (e.g., punched, cut, etc.) from the trace array 110 after molding the first insert molding component 112. In the example of a tape trace array support, the tape may be removed from the trace array 110 after molding the first insert molding component 112 and before molding the second insert molding component 114.

In some examples, the first insert molding component 112 and the second insert molding component 114 may each encapsulate both sides of the pre-molded lead frame 104. For example, the first insert molding component 112 and the second insert molding component 114 may each encapsulate a front surface and a back surface of the pre-molded lead frame 104.

In other examples, the first insert molding component 112 may encapsulate a first surface of the pre-molded lead frame 104 and the second insert molding component 114 may encapsulate a second surface of the pre-molded lead frame 104. For example, the first insert molding component 112 may be molded on a front surface and the second insert molding component 114 may be molded on a back surface of the pre-molded lead frame 104. An example of this approach is described in connection with FIG. 7.

In some examples, the first insert molding component 112 may act as a stand-off molding on a first surface of the pre-molded lead frame 104. The stand-off molding may include a number of molded parts that together form the first insert molding component 112. The second insert molding component 114 may be molded on a second surface of the pre-molded lead frame 104 and portions of the first surface of the pre-molded lead frame 104 left exposed by the first insert molding component 112. An example of this approach is described in connection with FIG. 8.

In the context of ink sensing, the lead frame assembly 102 fabricated with the two-step insert molding process described herein may achieve a die carrier with a fully enclosed lead frame 104 to improve ink robustness. The lead frame assembly 102 may enable ink-level and ink-type sensing with complex impedance measurement. The lead frame assembly 102 may further enable a low-cost ink level sensor solution.

Figure 2:
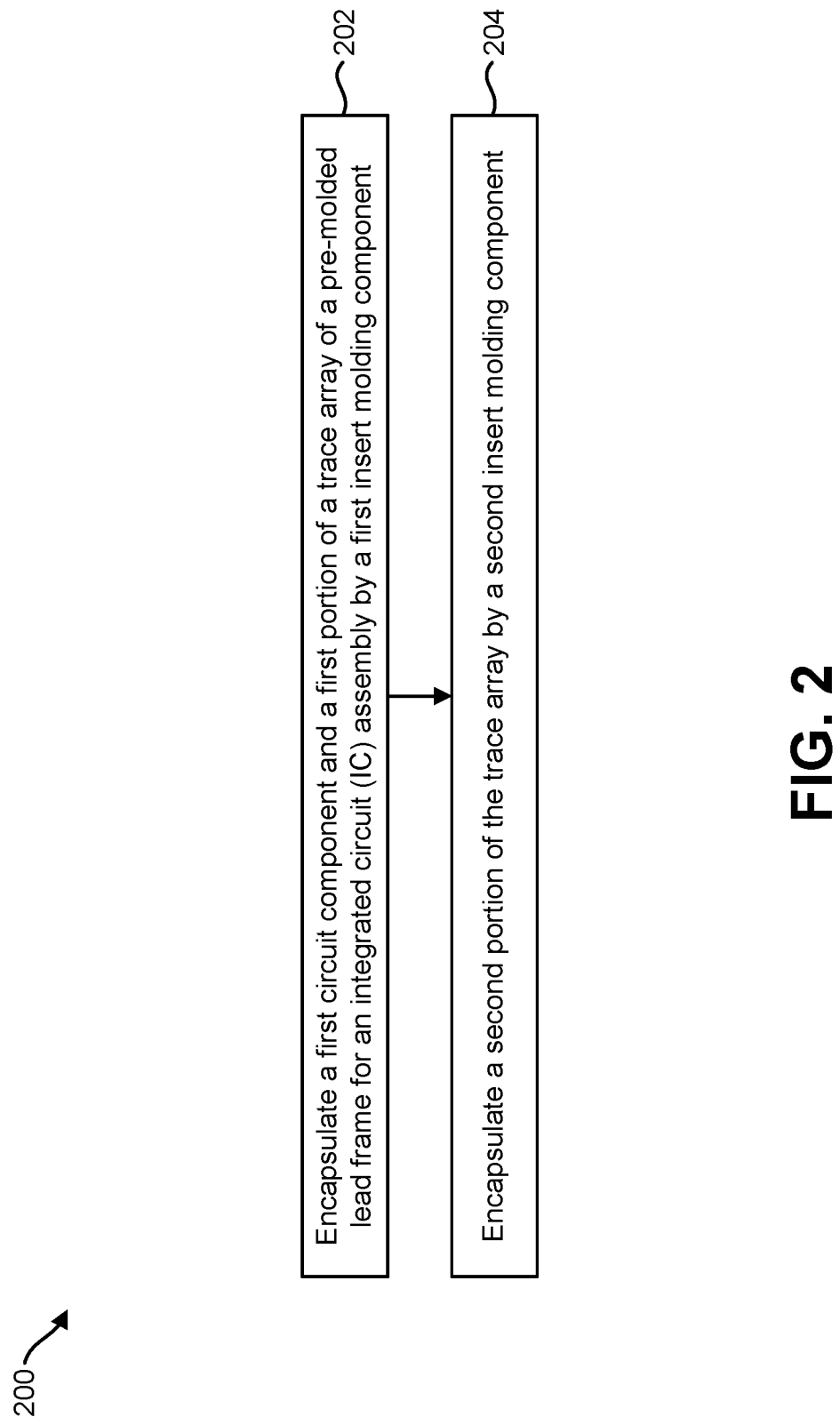
FIG. 2 is an example flow diagram illustrating a method for a two-step insert molding process to encapsulate a pre-molded lead frame for a lead frame assembly.

FIG. 2 is an example flow diagram illustrating a method 200 for a two-step insert molding process to encapsulate a pre-molded lead frame 104 for a lead frame assembly 102. A first circuit component 106 and a first portion of a trace array 110 of a pre-molded lead frame 104 for an integrated circuit (IC) assembly may be encapsulated 202 by a first insert molding component 112. The trace array 110 may connect the first circuit component 106 to a second circuit component 108 of the pre-molded lead frame 104. The first insert molding component 112 may be formed by molding the first insert molding component 112 on the first circuit component 106 and the first portion of the trace array 110. In some examples, the IC assembly may be a fluid sense device.

A second portion of the trace array 110 may be encapsulated 204 by a second insert molding component 114. The second insert molding component 114 may be formed by molding the second insert molding component 114 on the second portion of the trace array 110.

The first insert molding component 112 and the second insert molding component 114 may encapsulate the pre-molded lead frame 104 to prevent exposure of the pre-molded lead frame to a liquid. For example, the first insert molding component 112 and the second insert molding component 114 may seal portions of the pre-molded lead frame 104 against ink or other corrosive liquids when a portion of the lead frame assembly 102 is submerged in the liquid.

The first insert molding component 112 and the second insert molding component 114 may fully encapsulate the trace array 110. For example, the first insert molding component 112 and the second insert molding component 114 may completely surround the trace array 110.

In some examples, encapsulating 204 the second portion of the trace array 110 by the second insert molding component 114 may also include encapsulating the second circuit component 108 with the second insert molding component 114. An example of this approach is described in connection with FIG. 3.

In some examples, encapsulating 202 the first circuit component 106 and the first portion of the trace array 110 may also include encapsulating the second circuit component 108 with the first insert molding component 112. An example of this approach is described in connection with FIG. 5.

Figure 3:
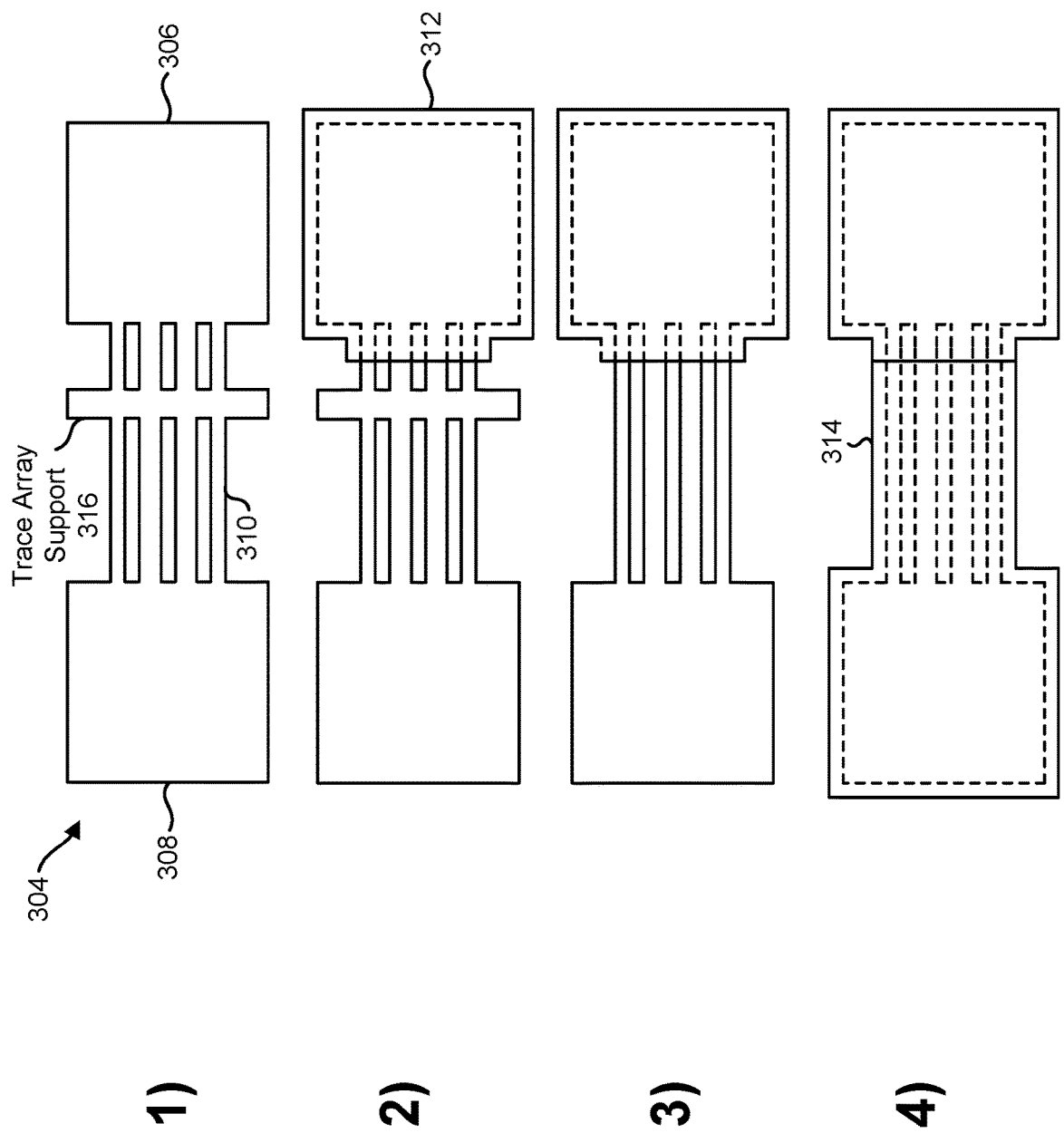
FIG. 3 is an example block diagram illustrating various steps in a two-step insert molding process to encapsulate a pre-molded lead frame.

FIG. 3 is an example block diagram illustrating various steps in a two-step insert molding process to encapsulate a pre-molded lead frame 304. In a first step (1), the pre-molded lead frame 304 includes a first circuit component 306, a second circuit component 308 and a trace array 310. The pre-molded lead frame 304 may be fabricated from a metallic material (e.g., copper, gold, metal alloys, etc.). For example, the first circuit component 306, a second circuit component 308 and a trace array 310 of the pre-molded lead frame 304 may be molded in a panel format.

The pre-molded lead frame 304 may include a trace array support 316. In some examples, the trace array support 316 may be a part of the pre-molded lead frame 304. For instance, the trace array support 316 may be integrally fabricated as part of the trace array 310. In other examples, the trace array support 316 may be a tape support that is applied to the trace array 310 to support the trace array 310.

In a second step (2), a first insert molding component 312 may be molded to the first circuit component 306 and a first portion of the trace array 310. It should be noted that the trace array support 316 supports the trace array 310 during the first insert molding of the first insert molding component 312. Upon molding the first insert molding component 312, the trace array 310 may be physically stabilized (e.g., supported) and electrically isolated by the first insert molding component 312.

In a third step (3), the trace array support 316 may be removed. For example, in the case of an integral support, the trace array support 316 may be punched to be removed from the trace array 310. In the case of a tape support, the tape may be removed (e.g., peeled off) from the trace array 310.

In a fourth step (4), a second insert molding component 314 may be molded to the second circuit component 308 and a second portion of the trace array 310. For example, the second insert molding component 314 may encapsulate the second circuit component 308 and the remainder of the trace array 310 left exposed by the first insert molding component 312.

Figure 4:
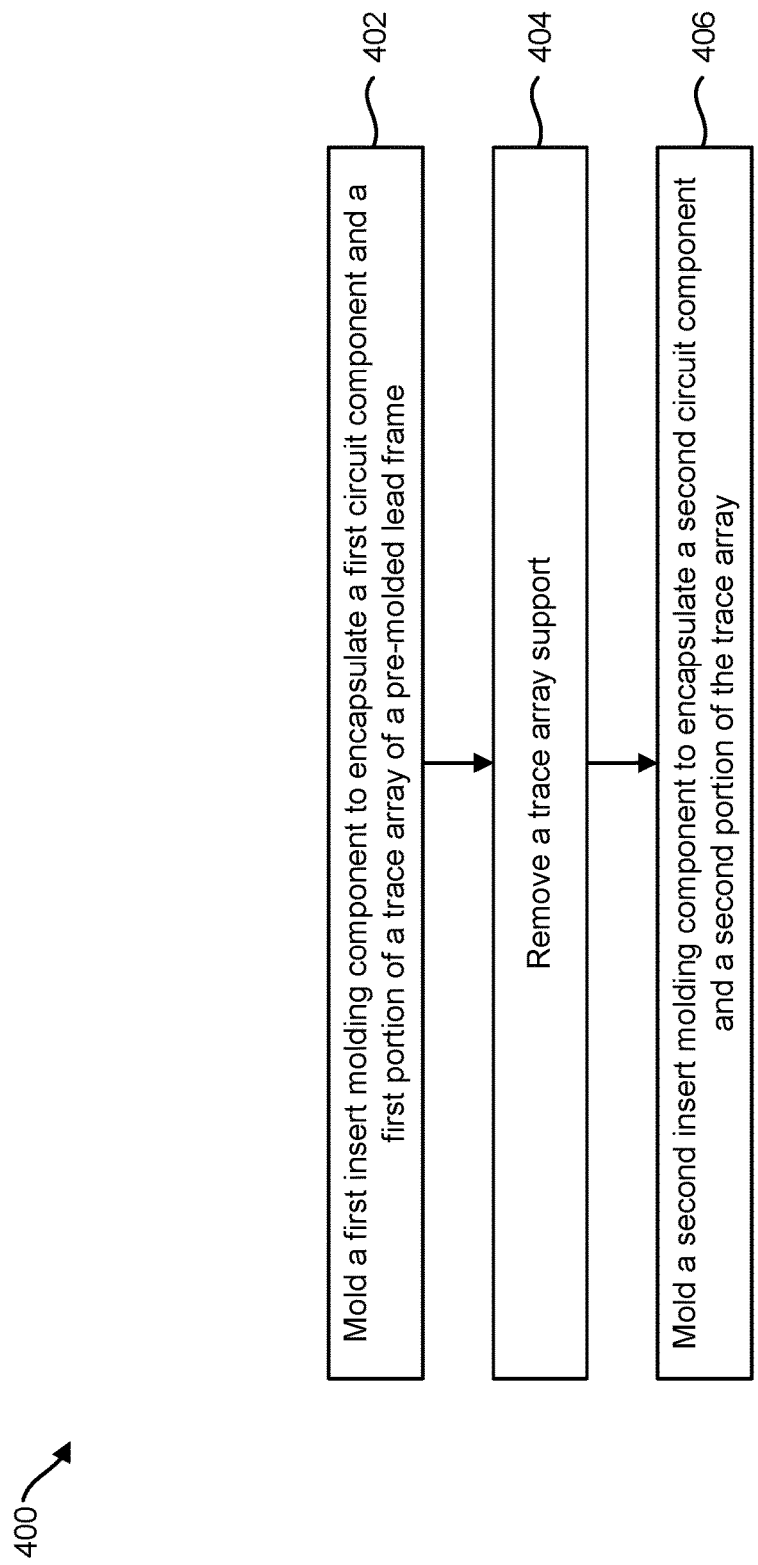
FIG. 4 is an example flow diagram illustrating another method for a two-step insert molding process to encapsulate a pre-molded lead frame.

FIG. 4 is an example flow diagram illustrating another method 400 for a two-step insert molding process to encapsulate a pre-molded lead frame 304. The pre-molded lead frame 304 may include a first circuit component 306, a second circuit component 308 and a trace array 310. The pre-molded lead frame 304 may also include a trace array support 316.

A first insert molding component 312 may be molded 402 to encapsulate a first circuit component 306 and a first portion of the trace array 310. For example, the first insert molding component 312 may be formed by injection molding a thermoplastic material or thermoset material onto the first circuit component 306 and the first portion of the trace array 310.

The trace array support 316 may be removed 404. For example, in the case of an integral support, the trace array support 316 may be punched to be removed from the trace array 310. In the case of a tape support, the tape may be removed (e.g., peeled off) from the trace array 310.

A second insert molding component 314 may be molded 406 to encapsulate a second circuit component 308 and a second portion of the trace array 310. For example, the second insert molding component 314 may be formed by injection molding the thermoplastic material or thermoset material onto the second circuit component 308 and the second portion of the trace array 310. The first insert molding component 312 and the second insert molding component 314 may fully encapsulate the trace array 310.

Figure 5:
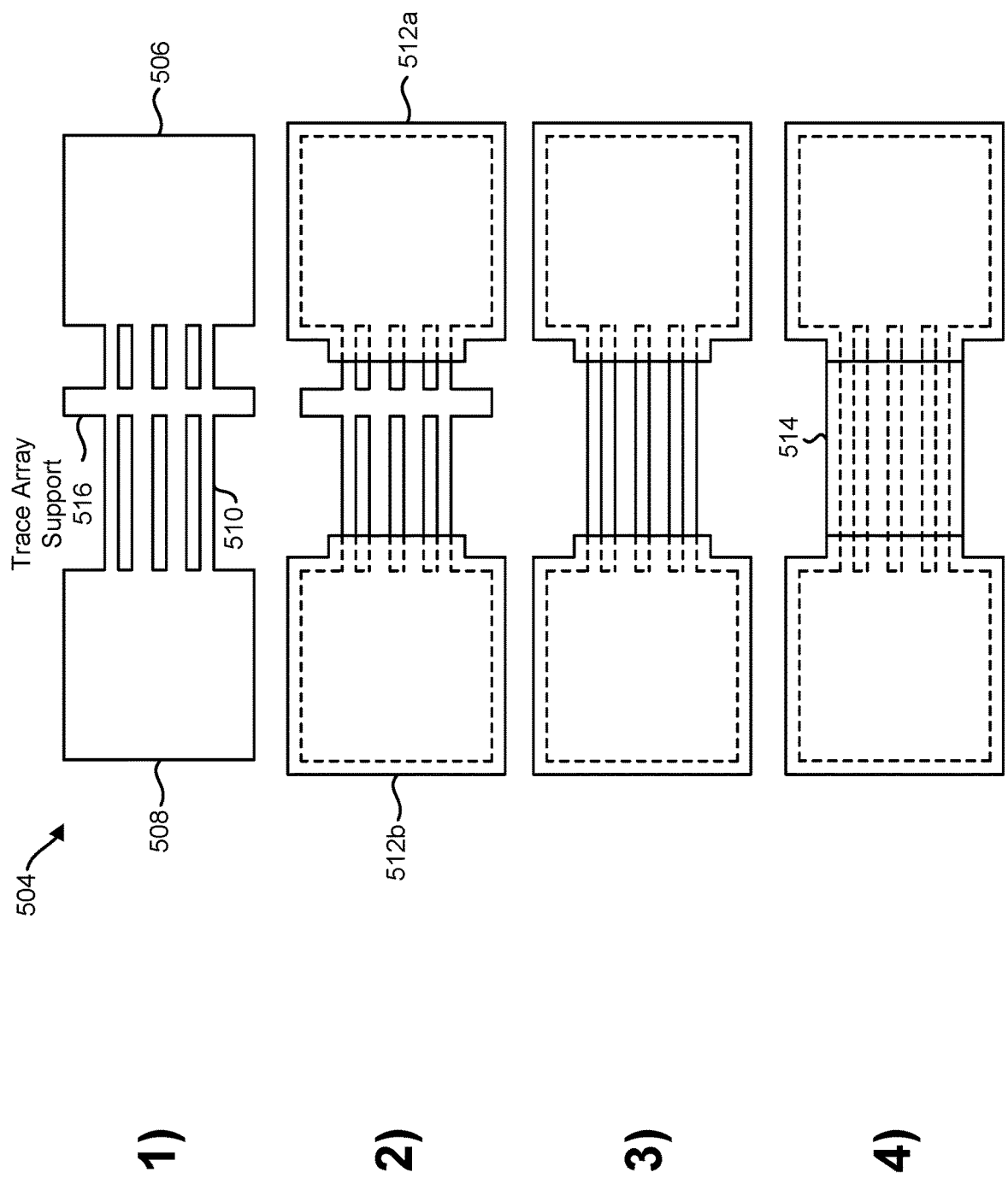
FIG. 5 is an example block diagram illustrating various steps in another two-step insert molding process to encapsulate a pre-molded lead frame.

FIG. 5 is an example block diagram illustrating various steps in another two-step insert molding process to encapsulate a pre-molded lead frame 504. In a first step (1), the pre-molded lead frame 504 includes a first circuit component 506, a second circuit component 508 and a trace array 510. The pre-molded lead frame 504 may also include a trace array support 516, which may be an integrated support or a tape support as described in connection with FIG. 3.

In a second step (2), a first insert molding component 512*a-b* may be molded to the first circuit component 506, the second circuit component 508 and a first portion of the trace array 510. In this case, the first insert molding component 512*a-b* may be molded in a single injection molding. However, the first insert molding component 512*a-b* may include multiple parts. For example, a first part of the first insert molding component 512*a* may encapsulate the first circuit component 506 and a portion of the trace array 510. A second part of the first insert molding component 512*b* may encapsulate the second circuit component 508 and another portion of the trace array 510. As used herein, the first and second parts of the first insert molding component 512*a-b* may be collectively referred to as the first insert molding component 512*a-b*. A central portion of the trace array 510 may remain exposed by the first insert molding component 512*a-b*.

It should be noted that the trace array support 516 supports the trace array 510 during the first insert molding of the first insert molding component 512*a-b*. Upon molding the first insert molding component 512*a-b*, the trace array 510 may be physically stabilized (e.g., supported) and electrically isolated by the first insert molding component 512*a-b*.

In a third step (3), the trace array support 516 may be removed. For example, in the case of an integral support, the trace array support 516 may be punched to be removed from the trace array 510. In the case of a tape support, the tape may be removed (e.g., peeled off) from the trace array 510.

In a fourth step (4), a second insert molding component 514 may be molded to a second portion of the trace array 510. For example, the second insert molding component 514 may encapsulate the second circuit component 508 and the remainder (e.g., the central portion) of the trace array 510 left exposed by the first insert molding component 512*a-b*.

Figure 6:
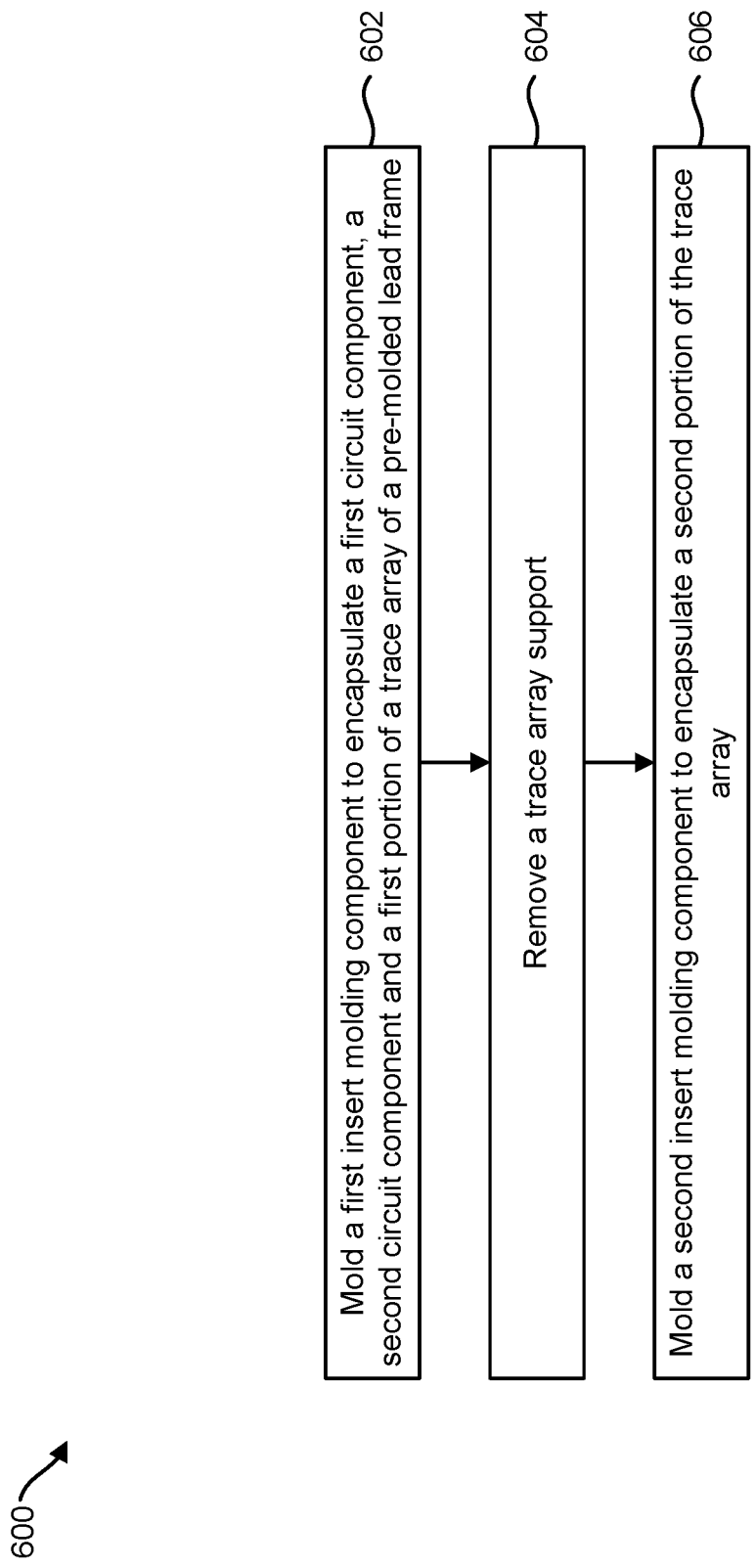
FIG. 6 is an example flow diagram illustrating another method for a two-step insert molding process to encapsulate a pre-molded lead frame.

FIG. 6 is an example flow diagram illustrating another method 600 for a two-step insert molding process to encapsulate a pre-molded lead frame 504. The pre-molded lead frame 504 may include a first circuit component 506, a second circuit component 508 and a trace array 510. The pre-molded lead frame 504 may also include a trace array support 516.

A first insert molding component 512*a-b* may be molded 602 to encapsulate a first circuit component 506, a second circuit component 508 and a first portion of the trace array 510. For example, a first part of the first insert molding component 512*a* may be formed by injection molding a thermoplastic material or thermoset material onto the first circuit component 506 and a portion of the trace array 510 adjacent to the first circuit component 506. A second part of the first insert molding component 512*b* may be formed by injection molding the thermoplastic material or thermoset material onto the second circuit component 508 and a portion of the trace array 510 adjacent to the second circuit component 508.

The trace array support 516 may be removed 604. For example, in the case of an integral support, the trace array support 516 may be punched to be removed from the trace array 510. In the case of a tape support, the tape may be removed (e.g., peeled off) from the trace array 510.

A second insert molding component 514 may be molded 606 to encapsulate a second portion of the trace array 510. For example, the second insert molding component 514 may be formed by injection molding the thermoplastic material or thermoset material onto the second portion of the trace array 510 which remains exposed by the first insert molding component 512*a-b*. The first insert molding component 512*a-b* and the second insert molding component 514 may fully encapsulate the trace array 510.

Figure 7:
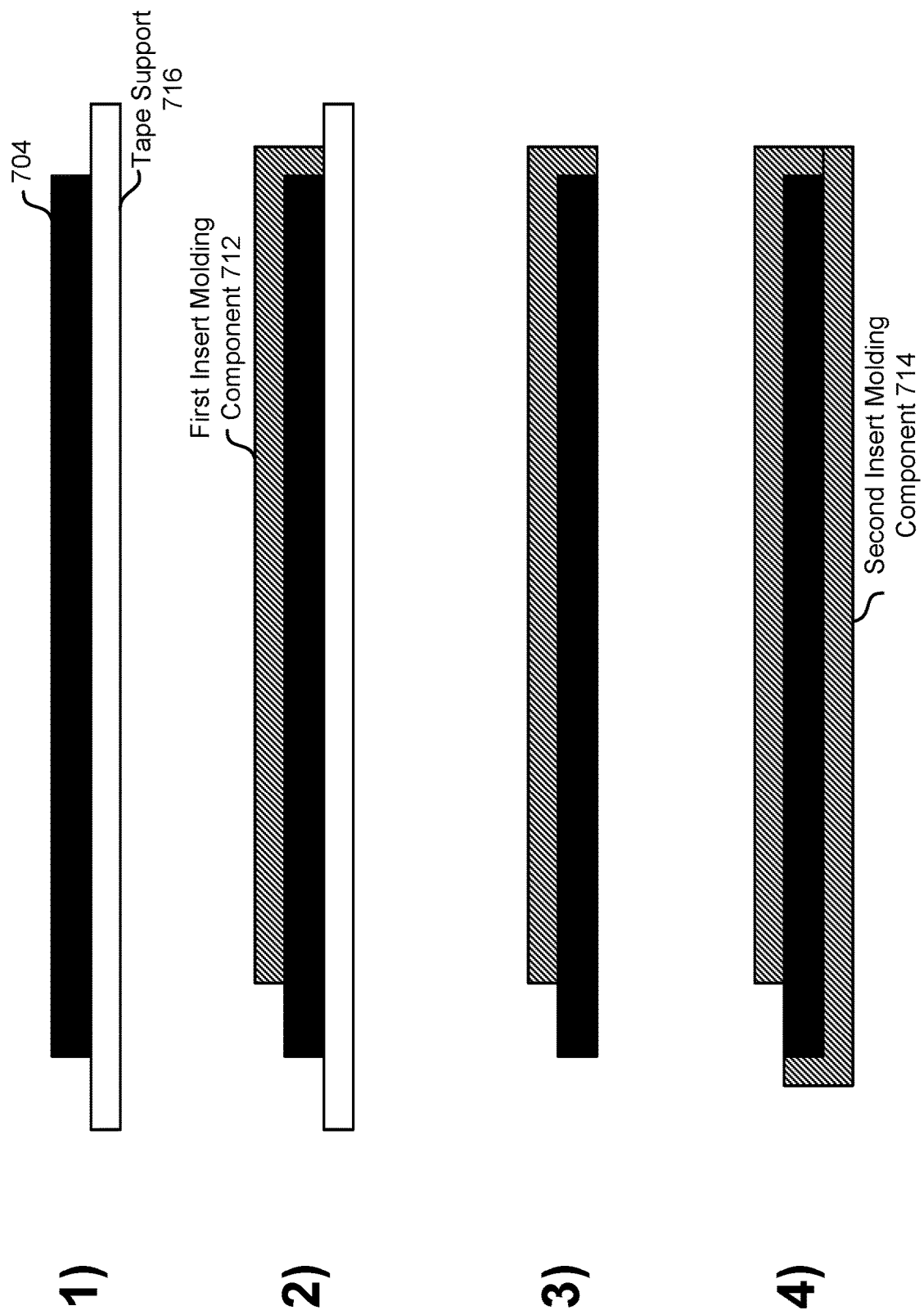
FIG. 7 is an example block diagram illustrating various steps in another two-step insert molding process to encapsulate a pre-molded lead frame.

FIG. 7 is an example block diagram illustrating various steps in another two-step insert molding process to encapsulate a pre-molded lead frame 704. FIG. 7 shows a section view of the pre-molded lead frame 704. In a first step (1), the pre-molded lead frame 704 may be mounted on a tape support 716. The pre-molded lead frame 704 may include a first circuit component, a second circuit component and a trace array (not shown).

In a second step (2), a first insert molding component 712 may be molded on a first surface of the pre-molded lead frame 704. For example, the first insert molding component 712 may be formed by injection molding a thermoplastic or thermoset material on the side of the pre-molded lead frame 704 exposed by the tape support 716. It should be noted that the first insert molding component 712 may leave portions of the pre-molded lead frame 704 exposed.

In a third step (3), the tape support 716 may be removed. For example, the tape support 716 may be removed (e.g., peeled off) from the pre-molded lead frame 704 to expose a second surface.

In a fourth step (4), a second insert molding component 714 may be molded to a second surface of the pre-molded lead frame 704. For example, the second insert molding component 714 may be formed by injection molding the thermoplastic or thermoset material on the second side of the pre-molded lead frame 704 exposed after removal of the tape support 716.

Figure 8:
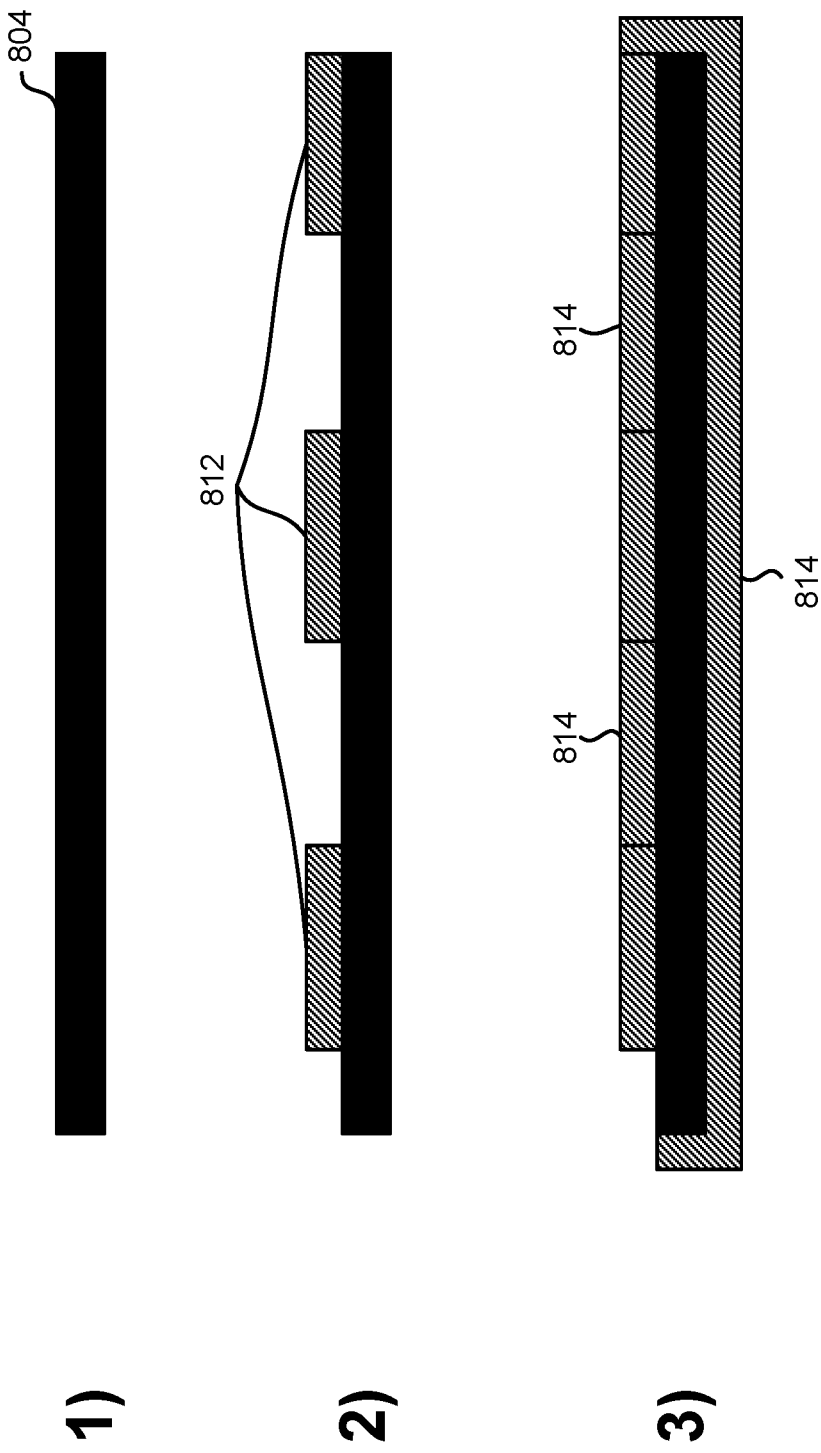
FIG. 8 is an example block diagram illustrating various steps in yet another two-step insert molding process to encapsulate a pre-molded lead frame.

FIG. 8 is an example block diagram illustrating various steps in yet another two-step insert molding process to encapsulate a pre-molded lead frame 804. FIG. 8 shows a section view of the pre-molded lead frame 804. In a first step (1), the pre-molded lead frame 804 may include a first circuit component, a second circuit component and a trace array (not shown).

In a second step (2), a first insert molding component 812 may be molded as a stand-off molding on a first surface of the pre-molded lead frame 804. For example, multiple discrete parts of the first insert molding component 812 may be formed by injection molding a thermoplastic or thermoset material on a first surface of the pre-molded lead frame 804. In some examples, one part of the first insert molding component 812 may encapsulate a portion of the trace array to stabilize and electrically isolate the trace array. It should be noted that the first insert molding component 812 may leave portions of the first surface of the pre-molded lead frame 804 exposed.

In a third step (3), a second insert molding component 814 may be molded to a second surface of the pre-molded lead frame 804 and portions of the first surface of the pre-molded lead frame 804 left exposed by the first insert molding component 812. For example, the second insert molding component 814 may be formed by injection molding the thermoplastic or thermoset material on the second side of the pre-molded lead frame 804 and between the stand-off molding of the first insert molding component 812.

The invention claimed is:

1. A method, comprising:
    encapsulating a first circuit component and a first portion of a trace array of a pre-molded lead frame for an integrated circuit (IC) assembly by a first insert molding component, wherein the trace array connects the first circuit component to a second circuit component of the pre-molded lead frame; and
    encapsulating a second portion of the trace array by a second insert molding component wherein the first insert molding component and the second insert molding component fully encapsulate the trace array.

2. The method of claim 1, wherein the first insert molding component and the second insert molding component encapsulate the pre-molded lead frame to prevent exposure of the pre-molded lead frame to a liquid.

3. The method of claim 1, wherein encapsulating the second portion of the trace array by the second insert molding component further comprises encapsulating the second circuit component with the second insert molding component.

4. The method of claim 1, wherein the first insert molding component is molded on a first surface of the pre-molded lead frame and the second insert molding component is molded on a second surface of the pre-molded lead frame.

5. The method of claim 1, wherein the first insert molding component is on a first surface of the pre-molded lead frame and the second insert molding component is molded on a second surface of the pre-molded lead frame and portions of the first surface of the pre-molded lead frame left exposed by the first insert molding component.

6. The method of claim 1, wherein the first insert molding component electrically isolates traces in the trace array to prevent an electrical short in the trace array.

7. A method, comprising:
    encapsulating a first circuit component and a first portion of a trace array of a pre-molded lead frame for an integrated circuit (IC) assembly by a first insert molding component, wherein the trace array connects the first circuit component to a second circuit component of the pre-molded lead frame; and
    encapsulating a second portion of the trace array by a second insert molding component;
    wherein encapsulating the first circuit component and the first portion of the trace array further comprises encapsulating the second circuit component with the first insert molding component.

8. A method, comprising:
    encapsulating a first circuit component and a first portion of a trace array of a pre-molded lead frame for an integrated circuit (IC) assembly by a first insert molding component, wherein the trace array connects the first circuit component to a second circuit component of the pre-molded lead frame;
    encapsulating a second portion of the trace array by a second insert molding component; and
    removing a trace array support after molding the first insert molding component and before molding the second insert molding component.

9. A lead frame assembly, comprising:
    a pre-molded lead frame for an integrated circuit (IC) assembly, wherein the pre-molded lead frame comprises a first circuit component, a second circuit component and a trace array that connects the first circuit component to the second circuit component;
    a first insert molding component encapsulating the first circuit component and a first portion of the trace array of the pre-molded lead frame; and
    a second insert molding component encapsulating a second portion of the trace array wherein the first insert molding component and the second insert molding component fully encapsulate the trace array.

10. The lead frame assembly of claim 9, wherein the first insert molding component and the second insert molding component encapsulate the pre-molded lead frame to prevent exposure of the pre-molded lead frame to a liquid.

11. The lead frame assembly of claim 9, wherein the second insert molding component further encapsulates the second circuit component.

12. The lead frame assembly of claim 9, wherein the first insert molding component and the second insert molding component are comprised of a thermoplastic material or thermoset material.

13. The lead frame assembly of claim 9, wherein the IC assembly is a fluid sense device.

14. A lead frame assembly, comprising:
    a pre-molded lead frame for an integrated circuit (IC) assembly, wherein the pre-molded lead frame comprises a first circuit component, a second circuit component and a trace array that connects the first circuit component to the second circuit component;
    a first insert molding component encapsulating the first circuit component and a first portion of the trace array of the pre-molded lead frame, wherein the first insert molding component further encapsulates the second circuit component; and
a second insert molding component encapsulating a second portion of the trace array.

\* \* \* \* \*